US012730012B2

(12) United States Patent
Chyurlia et al.

(10) Patent No.: US 12,730,012 B2
(45) Date of Patent: Sep. 8, 2026

(54) GAIN COMPENSATION FOR POWER AMPLIFIERS USING A TEMPERATURE SENSOR CIRCUIT

(71) Applicant: SKYWORKS SOLUTIONS, INC., Irvine, CA (US)

(72) Inventors: Pietro Natale Alessandro Chyurlia, Ottawa (CA); Gordon Glen Rabjohn, Ottawa (CA); Joseph A. Cuggino, Westford, MA (US); Anthony Francis Quaglietta, Methuen, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 956 days.

(21) Appl. No.: 18/046,010

(22) Filed: Oct. 12, 2022

(65) Prior Publication Data

US 2023/0117991 A1 Apr. 20, 2023

Related U.S. Application Data

(60) Provisional application No. 63/255,461, filed on Oct. 14, 2021.

(51) Int. Cl.

*G01K 3/08* (2006.01)
*G01K 7/00* (2006.01)
*H03F 3/19* (2006.01)

(52) U.S. Cl.

CPC ................. *G01K 3/08* (2013.01); *G01K 7/00* (2013.01); *H03F 3/19* (2013.01); *H03F 2200/468* (2013.01)

(58) Field of Classification Search

CPC ... G01K 3/08; G01K 7/00; G01K 7/01; H03F 3/19; H03F 2200/468; H03F 1/302; H03F 3/245; H03F 3/195

USPC ........................................................... 455/73

See application file for complete search history.

(56) References Cited

U.S. PATENT DOCUMENTS 3,346,805 A 10/1967 Hekimian
4,195,274 A 3/1980 Suganuma
5,477,188 A * 12/1995 Chawla .................. H03F 3/604 330/269
5,809,420 A 9/1998 Ichiyanagi et al.
6,097,240 A 8/2000 Lapushin
6,297,709 B1 10/2001 Wey et al.
6,335,821 B1 1/2002 Suzuki et al.
9,985,588 B2 5/2018 Rogers
10,320,336 B2 6/2019 Rogers
10,611,246 B2 * 4/2020 Zhou ......................... B60L 3/04

(Continued)

*Primary Examiner* — Eugene Yun
(74) *Attorney, Agent, or Firm* — Lando & Anastasi, LLP

(57) ABSTRACT

According to at least one example, an amplifier circuit includes an amplifier and a temperature sensor circuit. The temperature sensor circuit includes a first transistor thermally isolated from the amplifier and being configured to sense an ambient temperature, and a second transistor thermally linked to the amplifier and being configured to sense a temperature at the amplifier, the temperature sensor circuit being a differential circuit having a first path and a second path with the first and second transistors being arranged on the first and second paths of the differential circuit respectively. The temperature sensor circuit is configured to generate an output voltage inversely proportional to a temperature difference between the ambient temperature and the temperature at the amplifier.

22 Claims, 8 Drawing Sheets

(56) References Cited

U.S. PATENT DOCUMENTS

| | | | | |
|---|---|---|---|---|
| 2002/0135423 | A1* | 9/2002 | Yamashita | H03F 1/301 330/285 |
| 2004/0100339 | A1 | 5/2004 | Feilkas et al. | |
| 2009/0179706 | A1 | 7/2009 | Wong | |
| 2011/0187461 | A1 | 8/2011 | Mochizuki | |
| 2013/0127544 | A1 | 5/2013 | Murakami | |
| 2013/0187712 | A1 | 7/2013 | Cabanillas et al. | |
| 2014/0145785 | A1 | 5/2014 | Bandyopadhyay et al. | |
| 2016/0099711 | A1 | 4/2016 | Uemura et al. | |
| 2019/0279977 | A1 | 9/2019 | Ma et al. | |
| 2020/0136369 | A1 | 4/2020 | Chauhan et al. | |
| 2021/0083659 | A1 | 3/2021 | Mayer et al. | |
| 2021/0126598 | A1 | 4/2021 | Rogers | |
| 2022/0329211 | A1 | 10/2022 | Krishnan et al. | |
| 2023/0296446 | A1 | 9/2023 | Rabjohn et al. | |
| 2023/0299748 | A1 | 9/2023 | Rabjohn et al. | |
| 2023/0299749 | A1 | 9/2023 | Rabjohn et al. | |
| 2025/0044162 | A1 | 2/2025 | Hope | |

* cited by examiner

GAIN COMPENSATION FOR POWER AMPLIFIERS USING A TEMPERATURE SENSOR CIRCUIT

CROSS-REFERENCE TO RELATED APPLICATIONS

This application claims priority under 35 U.S.C. § 119(e) to U.S. Provisional Application Ser. No. 63/255,461, titled "GAIN COMPENSATION FOR POWER AMPLIFIERS USING TEMPERATURE SENSOR CIRCUIT," filed on Oct. 14, 2021, which is hereby incorporated by reference in its entirety.

BACKGROUND

Field

Examples of the disclosure relate to an amplifier circuit, and in particular an amplifier circuit for gain compensation. Examples of the disclosure also relate to a method for operating an amplifier circuit, and particularly a method for an amplifier circuit for gain compensation.

Description of the Related Technology

When an amplifier is turned on, the active amplification devices within the amplifier turn on and hence some level of self-heating of the amplifier and the ambient environment occurs. In some cases, an amplifier may have multiple amplification stages which may each experience some level of self-heating. This "self-heating" effect may result in a decrease of gain of the amplifier and/or gain variation over time which may cause degradation of the error vector magnitude (EVM) of the amplifier, which is a measure of linearity.

SUMMARY

According to one example, there is provided amplifier circuit comprising: an amplifier and a temperature sensor circuit, the temperature sensor circuit including a first transistor thermally isolated from the amplifier and being configured to sense an ambient temperature, and a second transistor thermally linked to the amplifier and being configured to sense a temperature at the amplifier, the temperature sensor circuit being a differential circuit having a first path and a second path with the first and second transistors being arranged on the first and second paths of the differential circuit respectively, the temperature sensor circuit being configured to generate an output voltage inversely proportional to a temperature difference between the ambient temperature and the temperature at the amplifier.

In one example, the amplifier circuit may further comprise a first resistor and a second resistor arranged on the first and second paths of the differential circuit respectively, and a third resistor arranged to couple the first and second paths of the differential circuit in parallel.

In one example, the amplifier circuit may further comprise a bias network coupled to the temperature sensor circuit and being configured to bias the amplifier with a reference current modulated at least in part by the output voltage.

In one example, the amplifier circuit may comprise a third transistor coupled to the temperature sensor circuit and being configured to receive the output voltage, wherein the bias network comprises a fourth transistor coupled to the third transistor.

In one example, the third transistor may be configured to draw less current in response to heating at the second transistor.

In one example, the fourth transistor may be configured to draw more current in response to the third transistor drawing less current.

In one example, the bias network may further comprise a current mirror reference device which may include the fourth transistor.

In one example, the amplifier circuit further comprises a fifth transistor coupled to the third transistor, and a radio frequency gain device having a sixth transistor coupled to the fourth and fifth transistors, the radio frequency gain device being configured to provide a level of gain to an input signal dependent on a current at the sixth transistor.

In one example, the first transistor may comprise a base, a collector, and an emitter, the collector of the first transistor being coupled to the base of the first transistor.

In one example, the second transistor may comprise a base, a collector, and an emitter, the collector of the second transistor being coupled to the base of the second transistor.

In one example, the third transistor may comprise a base, a collector, and an emitter, the temperature sensor circuit being coupled to the base of the third transistor.

In one example, the fourth transistor may comprise a base, a collector, and an emitter, the collector of the third transistor being coupled to the collector of the fourth transistor.

In one example, the amplifier circuit may further comprise a voltage source configured to provide a regulated input voltage to the temperature sensor circuit.

In one example, the amplifier circuit may further comprise a supply voltage source configured to provide an amplifier supply voltage to the temperature sensor circuit.

In one example, the amplifier may be a first amplifier and the amplifier circuit may further comprise: a second amplifier coupled to the first amplifier; and a bias network coupled to the temperature sensor circuit and being configured to bias the second amplifier with a reference current modulated at least in part by the output voltage.

According to another example, there is provided a radio frequency module including an amplifier circuit comprising: an amplifier configured to provide a radio frequency signal; and a temperature sensor circuit, the temperature sensor circuit including a first transistor thermally isolated from the amplifier and being configured to sense an ambient temperature, and a second transistor thermally linked to the amplifier and being configured to sense a temperature at the amplifier, the temperature sensor circuit being a differential circuit having a first path and a second path with the first and second transistors being arranged on the first and second paths of the differential circuit respectively, the temperature sensor circuit being configured to generate an output voltage inversely proportional to a temperature difference between the ambient temperature and the temperature at the amplifier.

According to another example, there is provided a wireless communication device including an amplifier circuit comprising: an amplifier configured to provide a radio frequency signal; and a temperature sensor circuit, the temperature sensor circuit including a first transistor thermally isolated from the amplifier and being configured to sense an ambient temperature, and a second transistor thermally linked to the amplifier and being configured to sense a temperature at the amplifier, the temperature sensor circuit being a differential circuit having a first path and a second path with the first and second transistors being arranged on the first and second paths of the differential circuit respectively, the temperature sensor circuit being configured to generate an output voltage inversely proportional to a temperature difference between the ambient temperature and the temperature at the amplifier.

According to another example, there is provided a method for an amplifier circuit, the method comprising: a first transistor of a temperature sensor circuit sensing an ambient temperature; a second transistor of the temperature sensor circuit sensing a temperature at an amplifier, the temperature sensor circuit being a differential circuit having a first path and a second path with the first and second transistors being arranged on the first and second paths of the differential circuit respectively; and the temperature sensor circuit generating an output voltage inversely proportional to a temperature difference between the ambient temperature and the temperature at the amplifier.

In one example, the temperature sensor circuit may further comprise a first resistor and a second resistor arranged on the first and second paths of the differential circuit respectively, and a third resistor arranged to couple the first and second paths of the differential circuit in parallel.

In one example, the method may further comprise a bias network, coupled to the temperature sensor circuit, biasing the amplifier with a reference current modulated at least in part by the output voltage.

In one example, the amplifier circuit may comprise a third transistor coupled to the temperature sensor circuit; the bias network may comprise a fourth transistor coupled to the third transistor and to the amplifier; and the method may further comprise the third transistor receiving the output voltage from the temperature sensor circuit.

In one example, the method may further comprise the temperature sensor circuit receiving, from a voltage source, a regulated input voltage, or receiving, from a supply voltage source, an amplifier supply voltage.

Still other aspects, examples, and advantages of these exemplary aspects and examples are discussed in detail below. Examples disclosed herein may be combined with other examples in any manner consistent with at least one of the principles disclosed herein, and references to “an example,” “some examples,” “an alternate example,” “various examples,” “one example” or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Figure 1:
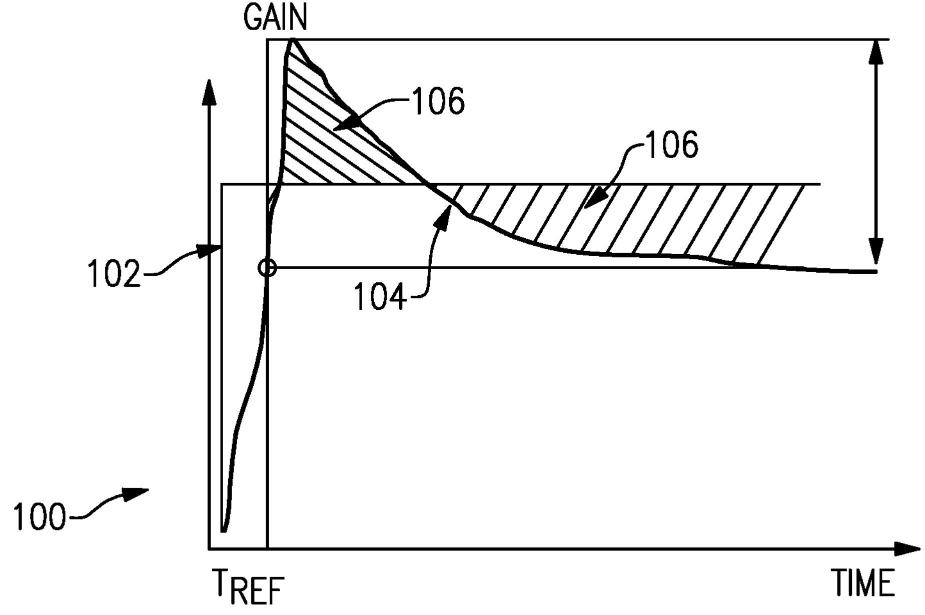
FIG. 1 illustrates a graph comparing an ideal gain plot and a practical gain plot.

Aspects and examples described herein are related to an amplifier circuit for providing improved gain compensation. Examples described herein may provide advantages including improved gain compensation, improved linearity, improved EVM, a circuit design that is less sensitive to device or component placement and allows for additional parameters for tuning gain compensation, reduced process sensitivity, less sensitivity to die attach and other environmental factors, a faster design cycle, and so forth.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of “including,” “comprising,” “having,” “containing,” “involving,” and variations thereof is meant to encompass the items listed thereafter and equivalents thereof as well as additional items. References to “or” may be construed as inclusive so that any terms described using “or” may indicate any of a single, more than one, and all of the described terms.

Existing techniques to compensate for such gain droop/variation include employing a silicon controller using programmable RC time delay in combination with a temperature dependent current source. Such a system requires the added die of the controller which significantly increases cost as well as requiring test time to program the controller.

Other techniques include using simple fixed RC delays on the bias of a power amplifier, but this only allows for correction at either the beginning or the end of a burst, rather than flattening out the entire burst. There are multiple time constants that cannot be fixed with a single R-C. Also, the time constant may depend on various poorly controlled process characteristics, like die attach quality, heat sinking, and supply voltage, making a single fixed RC inappropriate over a range of process variables.

As discussed above, amplifiers may produce a "self-heating" effect which may cause degradation of the EVM of the amplifier. Signal bursts of 4 ms and 5 ms length have become standard for more advanced wireless communication networks, such as Wi-Fi networks, in order to meet the increased demand for data transfer across such wireless networks. This poses a challenge for Wi-Fi power amplifiers (PAs) as there is a large thermally dependent gain response as the amplifier heats up during the signal burst. Essentially, the amplifier experiences a gain "droop" over time as the amplifier heats up due to the semiconductor properties and passive components changing with temperature resulting in less gain from the warmer amplifier. This in turn limits performance by setting a lower limit on the Dynamic Error Vector Magnitude (DEVM) that the amplifier can achieve. To achieve low levels of Error Vector Magnitude (EVM), for example −47 dB maximum level for 802.11ax networks, the gain delta or change over a 5 ms burst must remain under 0.045 dB.

Examples of systems and methods for temperature compensated power amplifier gain compensation disclosed herein can be applied to a variety of amplifiers, such as power amplifiers, low noise amplifiers, pulse amplifiers, driver amplifiers, instrumentation amplifiers, gain blocks, or any amplifier needing excellent short-term stability. Furthermore, the examples disclosed herein compensate for gain droop experienced by amplifiers that are heating up without the need to know how quickly the temperature of the amplifier is changing (for example, the thermal environment of the amplifier need not be known in advance).

FIG. 1 illustrates a comparison graph 100 showing an ideal gain plot and a practical gain plot for an amplifier according to an example. A first plot 102 provides ideal gain performance: when the amplifier is turned on, the ideal amplifier immediately reaches a peak gain value and maintains the peak gain value indefinitely. In comparison, a second plot 104 provides an example of practical gain performance: when the amplifier turns on, there is a period of delay before the amplifier ramps up to a peak gain value and gradually decreases from the peak gain value over time. Practical gain performance as illustrated by the second plot 104 creates various instances of error 106, or in other words, differences from the ideal gain performance of the amplifier. Error 106 is measured in FIG. 1 beyond a $t_{ref}$ (for example, the beginning of preamble) point. It may be advantageous to minimize the error as much as possible for an amplifier.

Examples described herein provide circuits and/or methods for reducing gain error, and particularly for compensating for gain droop. In some examples, an amplifier or power amplifier circuit may be configured to self-correct and/or otherwise respond to heating at an amplifier network of the power amplifier. Moreover, a power amplifier may include various devices configured to detect heating at and/or near the amplifier network. Responses to heating may be performed automatically in response to detected heating. Some examples may be configured for use with multi-stage (e.g., two or more amplification stages) while some examples may be configured for use with single-stage amplifiers as well or alternatively.

Figure 2:
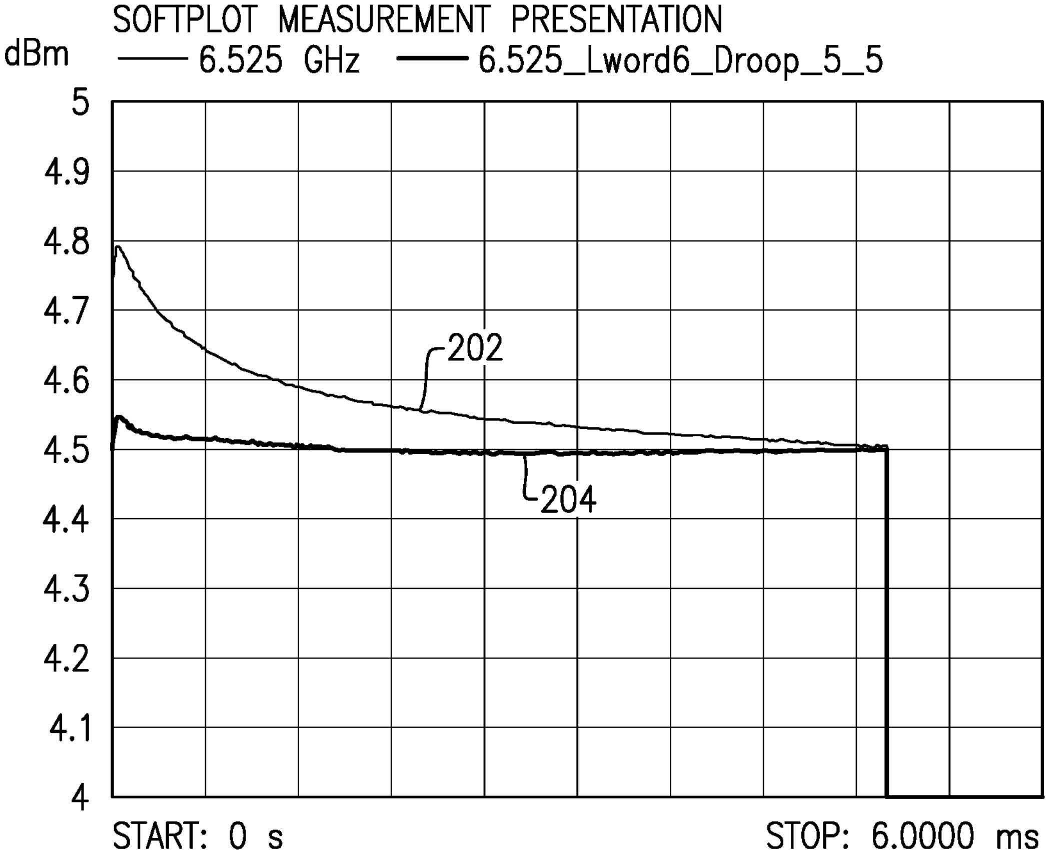
FIG. 2 illustrates a graph comparing gain vs. time of amplifiers with a natural response and compensated response.

FIG. 2 is a graph illustrating two curves for a gain vs. time response of a power amplifier, which in this example is a GaAs power amplifier, according to an example. The first curve 202 shows a natural response (that is, no advanced techniques have been implemented to correct the curve or compensate for gain droop). The uncorrected response exhibits a change in gain of 0.3 dB over the signal burst, and the EVM achievable may be limited to approximately −30 dB. The second curve 204 shows an almost ideal response, which has been corrected using design techniques in accordance with examples described herein. This corrected or compensated response exhibits a change in gain of less than 0.03 dB, and can achieve an EVM or −47 dB. This second curve 204 meets the requirements for current high performance Wi-Fi communications.

Figure 3:
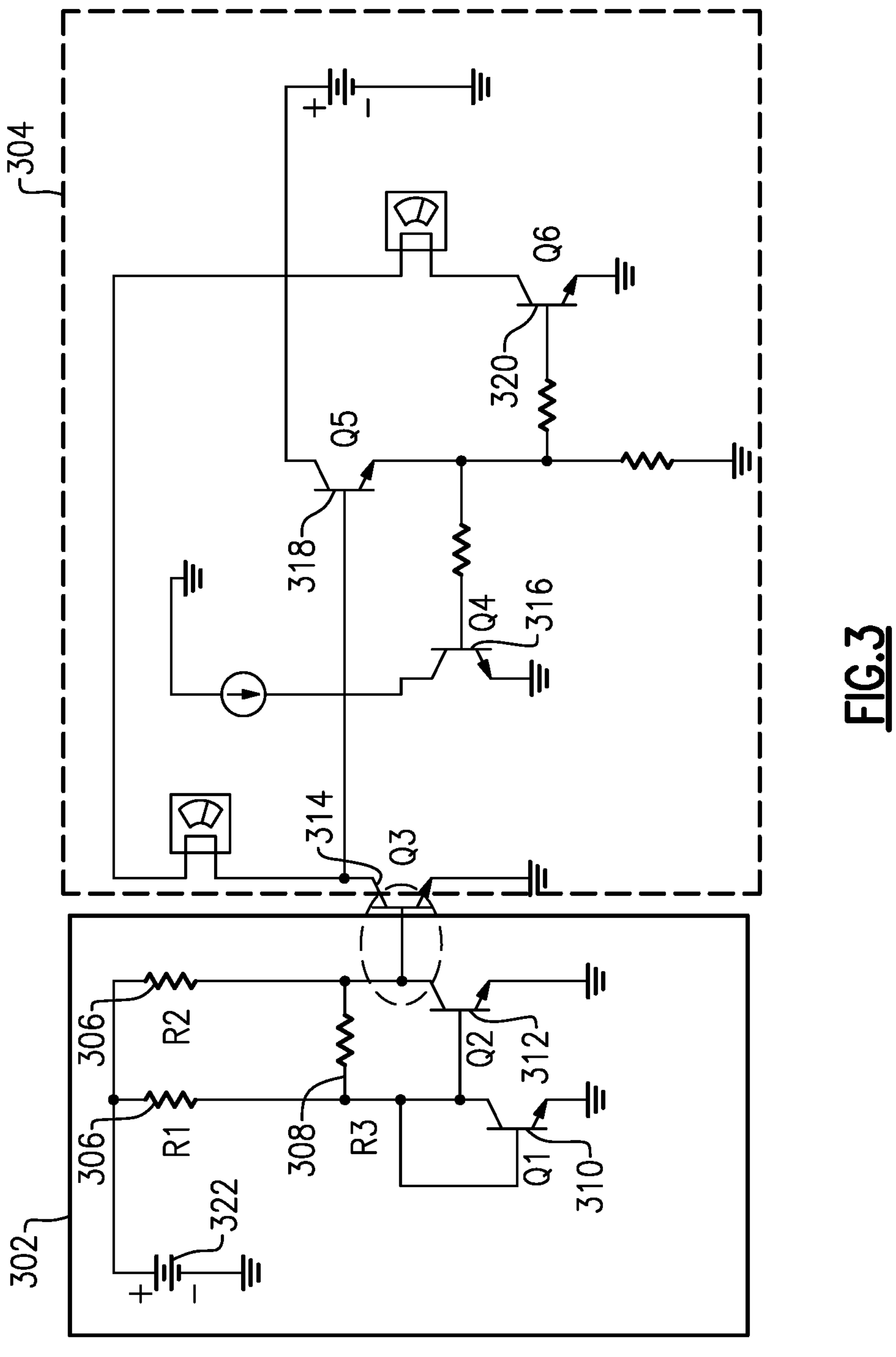
FIG. 3 illustrates a schematic diagram of part of an amplifier circuit including a temperature sensor circuit and bias circuit according to aspects of the present disclosure.

FIG. 3 illustrates part of an amplifier circuit for providing gain compensation according to some examples. Examples of amplifier circuits described provide a closed loop solution to compensating for gain droop. The amplifier circuit comprises a temperature sensor circuit 302. The temperature sensor circuit 302 comprises a first transistor 310 which is thermally isolated from an amplifier (not shown). The temperature sensor circuit 302 also comprises a second transistor 312, which is thermally linked to the amplifier. The temperature sensor circuit 302 is arranged as a differential circuit having a first path and a second path, with the first transistor 310 and second transistor 312 being arranged on the first and second paths of the differential circuit respectively. By providing a differential circuit, the circuit is subject to less process sensitivity.

The temperature sensor circuit 302 also comprises a group of resistors 306 including a first resistor and a second resistor arranged on the first and second paths of the circuit respectively. Significantly, the circuit 302 also comprises a third resistor 308 arranged to couple the first and second paths of the differential circuit in parallel.

The temperature sensor circuit 302 may be part of a temperature compensation circuit which further includes a third transistor 314. That is, the amplifier circuit further comprises the third transistor 314 which is coupled to the temperature sensor circuit 302.

The amplifier circuit also comprises a bias circuit 304. In this example, this is a normal bias circuit for an amplifier such as a stage one amplifier of a multi-stage amplifier. The bias circuit 304 comprises: a fourth transistor 316 which here is part of a current mirror reference device; a fifth transistor 318 which here is part of a current mirror helper device; and a sixth transistor 320 which here is part of a radio-frequency gain device. In this example, the third transistor 314 is coupled to the fourth transistor 316, the fifth transistor 318, and the sixth transistor 320.

The term "coupled" may describe both direct and indirect connections. That is, two components or device that are "coupled" may be in direct connection with one another, or may be in electrical connection with one another through one or more other components or devices.

Each of the transistors 310-320 may comprise a base, a collector, and an emitter. In some examples, the collector of the first transistor 310 may be coupled to the base of the first transistor 310 and to the base of the second transistor 312, the base of the third transistor 314 may be coupled to the temperature sensor circuit 302, the collector of the third transistor 314 may be coupled to the collector of the fourth transistor 316, the base of the fourth transistor 316 may be coupled to the base of the sixth transistor 320, the emitter of the fifth transistor 318 may be coupled to the base of the sixth transistor 320, and the collector of the fifth transistor 318 may be coupled to the collector of the fifth transistor 318. One of more of the couplings may comprise a resistor component. Although a particular bias network is illustrated as an example, alternative bias networks suitable for having a current modulated by the temperature compensation circuit 302 may be used in alternate examples.

The gain provided by the amplifier circuit is, in part, determined by the current through the sixth transistor 320.

As the current through the sixth transistor 320 is increased, the gain goes up, and as the current is decreased, the gain is reduced.

During use, the amplifier (not shown) will increase in temperature during a signal pulse (for example, self-heating as a result of turning on). The first transistor 310 is located away from the amplifier, and is configured to sense an ambient temperature of the circuit. That is, the first transistor 310 can be considered to be thermally isolated from the amplifier.

The second transistor 312 is located close to the amplifier, or in other words is thermally linked to the amplifier. The second transistor 312 is configured to sense a temperature at the amplifier. Thus, the second transistor 312 is configured to sense the increase in temperature of the amplifier.

The term "thermally linked" may refer to a physical and/or non-physical connection between multiple devices wherein heating at one of the devices causes heating at another of the devices. Similarly, the term "thermally isolated" may refer to an absence of a physical and/or non-physical connection between multiple devices wherein heating at one of the devices does not cause appreciable heating at another of the devices.

The temperature sensor circuit 302 is configured to provide a temperature-dependent voltage output $V_{sense}$ which is inversely proportional to the temperature difference between the first transistor 310 and the second transistor 312 sensed by the temperature sensor circuit 302.

The output voltage is provided to the third transistor 314 from the temperature sensor circuit 302. This voltage through the third transistor 314 is used to "steal" current away from the fourth transistor 316 in the bias circuit 314 by modulating the base voltage of the third transistor 314. The third transistor 314 may be considered a current-stealing device.

In more detail, as the temperature difference or temperature delta between the first transistor 310 and the second transistor 312 increases (that is, as the amplifier heats up), the output voltage $V_{sense}$ decreases. Therefore, less current is used or stolen by the third transistor 314 from the current-mirror device or fourth transistor 316. In other words, the third transistor 314 is configured to draw less current in response to heating at the amplifier, and the fourth transistor 316 is configured to draw more current in response to the third transistor 314 drawing less current. This therefore increases the gain of the device as more current is provided through the fourth transistor 316 (and fifth transistor 318) to the radio-frequency gain device. In this way, the amplifier circuit can advantageously help keep the gain of the amplifier level across a signal burst by compensating for the gain droop in the device due to the heating of the transistors. This therefore helps to minimize or cancel out the changing gain vs. time characteristic of the amplifier and thus achieve a low EVM. In addition, by providing a temperature compensation circuit in this way, the need for a large capacitor to provide RC compensation is removed. Such a large capacitor may not be implemented on-die.

According to aspects of the present disclosure, no external die is required to achieve the gain compensation, making examples of the amplifier circuit described smaller and less expensive than existing arrangements requiring external dies or large components not implemented on-die. In addition, as examples described use die temperature to track a change in temperature and perform the compensation, improved temperature tracking is provided over an arrangement using an external component such as RC compensation or a controller which has no information regarding die temperature. Further, the current required to perform the required compensation is smaller than that of existing controller-type arrangements.

The first and second resistors of the group of resistors 306, and the third resistor 308, are used to determine the properties of the temperature compensation circuit, and thus the gain compensation of the amplifier network. Specifically, in some examples, the third resistor 308 can be used to change the slope of a current vs. temperature characteristic of the sixth transistor 320, which may be relevant to optimization of the performance of the amplifier.

Figure 4:
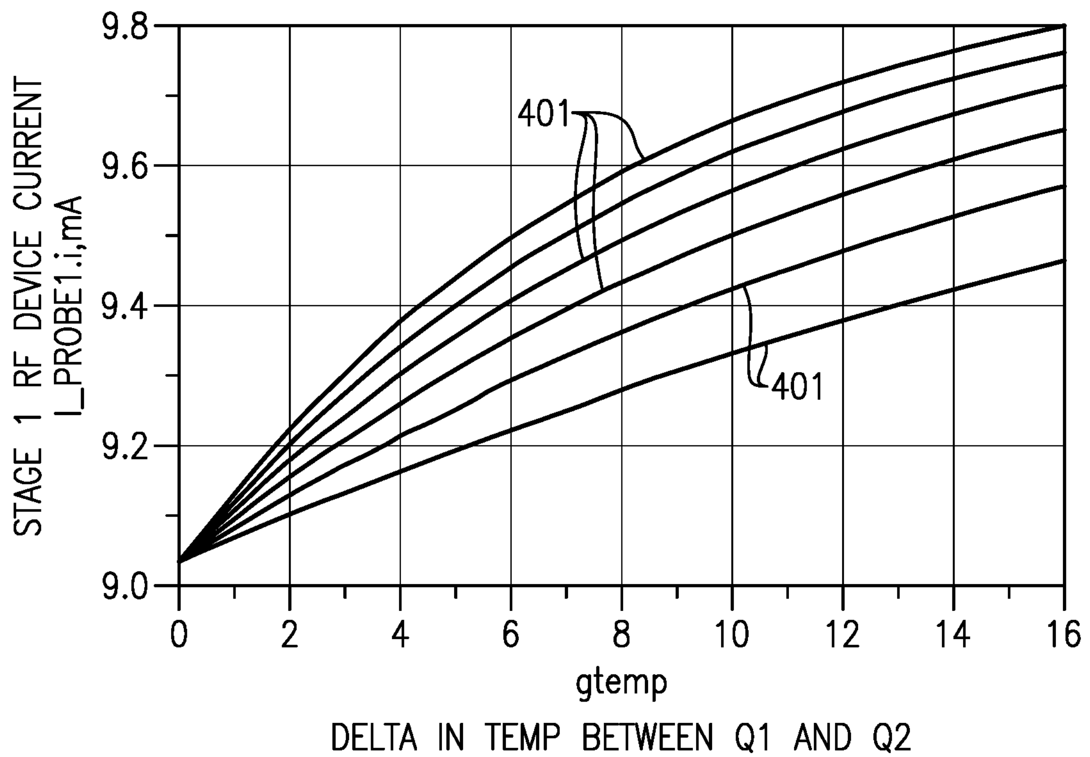
FIG. 4 illustrates a graph showing change in current vs. temperature difference for varying values of resistor in an amplifier circuit according to aspects of the present disclosure.

FIG. 4 illustrates the change in current of the radio-frequency gain device vs. temperature difference between the first transistor 310 and the second transistor 312 for various values 401 of the third resistor 308 according to an example. The change in current and therefore gain response depends at least in part on the value of the third resistor 308. This advantageously provides another tuning parameter to the design of the amplifier circuit. In other words, not only is the positioning of the components of the thermal sensor circuit a determining factor of the level of compensation achieved, but the compensation achieved may also be advantageously tuned by adjusting the value of the third resistor 308.

Accordingly, whereas existing designs may only implement a diode-connected device to generate a voltage which drives the base of a transistor, examples of the disclosure provide a temperature sensor circuit implemented by examples described herein. Hence, in such diode-connected designs, the effectiveness of the compensation technique may have been necessarily tied to the placement of that particular diode device. Both the placement of the first transistor 310 and the second transistor 312 providing the temperature sensing, as well as the selection of the value of the third resistor 308, can set the current vs temperature curve. This means that rather than having to lay out multiple versions of the circuit in order to optimize the position of the thermal sensor, the temperature sensor circuit can be implemented and subsequently optimized by adjusting the value of the third resistor 308. This may be simpler and more convenient than repositioning active devices around an amplifier die.

Figure 5:
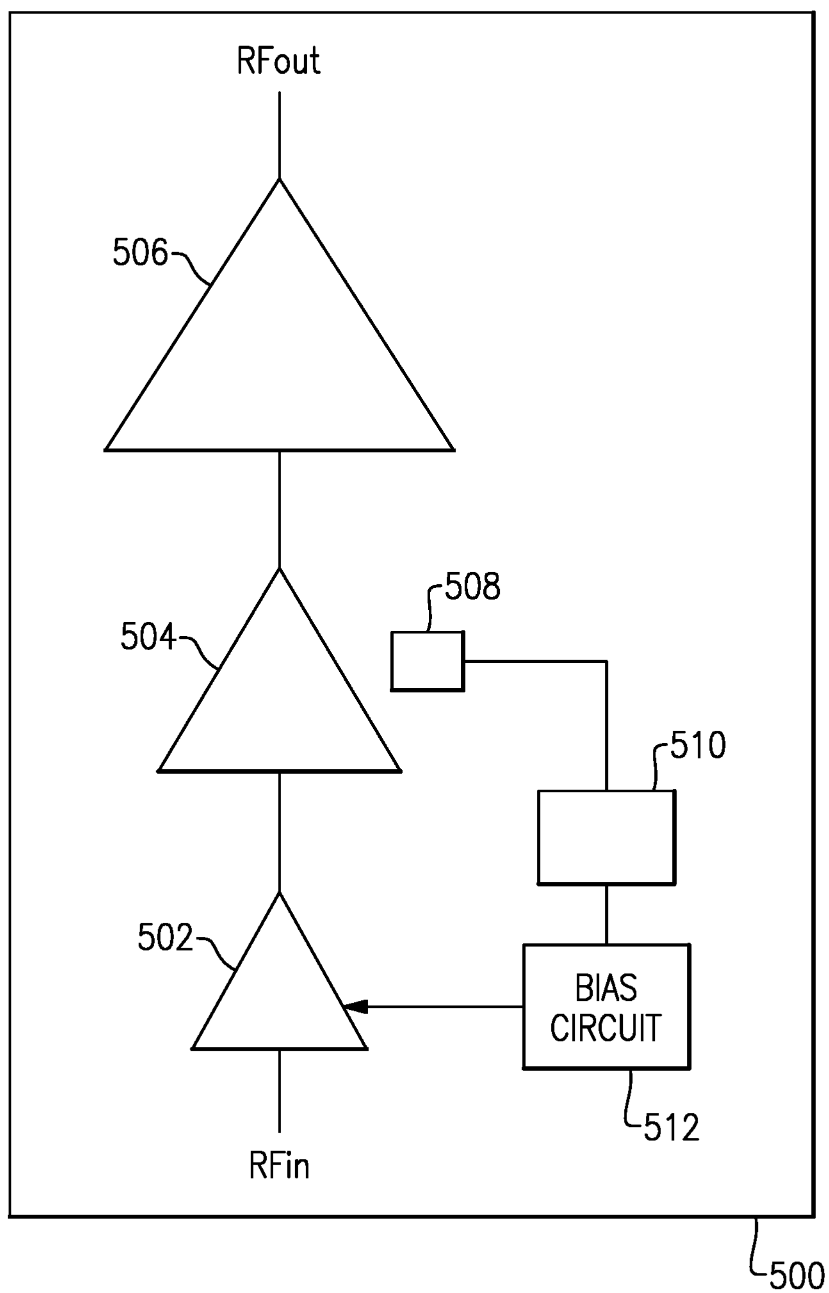
FIG. 5 illustrates a schematic diagram of an amplifier circuit according to aspects of the present disclosure.

FIG. 5 illustrates an example implementation of the amplifier circuit according to some examples. In this example, the amplifier circuit is applied to a multi-stage amplifier network, and in particular a three-stage GaAs amplifier network. The source of heat in this example is the second stage 504 of the multi-stage network. A second transistor 508 of the temperature sensor circuit may be arranged to be in close proximity to and/or thermally linked to the second amplifier 504, and specifically to a radio-frequency transistor array of the second stage 504. However, the second transistor 508 may be additionally or alternatively positioned in close proximity to and/or thermally linked to another stage of the amplifier such as the first stage 502 and/or the third stage 506.

The proximity between the second transistor 508 with the second stage (or any other appropriate stage used as a heat source) may be a process limitation for how close one transistor can be to another. The transistor and relevant amplifier stage may be as close as possible based on the process limitations. For example, the proximity of devices may be limited to no closer than approximately three microns.

The second stage 504 may be used as the source of heat in this example as, in some examples, increasing stages provide increasing heat. That is, the second stage 504 may generate more heat than the first stage 502 and hence can create a more distinct voltage vs. change in temperature curve. The first stage 502 in the amplifier may infrequently exhibit much temperature change over a signal burst as it is smaller and therefore less heat is dissipated. In addition, the circuits are arranged in this way as the first stage 502 and the second stage 504 of the amplifier network are relatively close to one another.

The second transistor 508, which may be positioned close to the second stage 504, is coupled to the remainder of the temperature compensation circuit 510, which includes the remainder of the temperature sensor circuit 302 as well as the third transistor 304. The remainder of the temperature sensor circuit 510 includes the first transistor 310 which is thermally isolated from the second stage 504 and is configured to sense an ambient temperature of the amplifier network. In this way, a temperature difference between the first transistor 310 and the second transistor 312 can be determined. The temperature sensor circuit generates an output voltage dependent at least in part on the temperature difference between the first transistor 310 and the second transistor 312 (or between the temperature at the second stage 504 and an ambient temperature). This output voltage is provided to the third transistor 314 in the temperature compensation circuit 510. Specifically, this output voltage drives the base of the third transistor 314, which is used to steal current from the bias circuit 512 coupled to the temperature compensation circuit 510. Specifically, the third transistor 314 steals current from the fourth transistor 316, the amount of stolen current being dependent on the output voltage, which is in turn dependent on the temperature difference between the first transistor 310 and the second transistor 312. The bias network 512 can then bias the amplifier, and specifically the first stage 502, with a reference current which is modulated at least in part by the output voltage.

Although not illustrated, the temperature sensor circuit receives an input voltage. In some examples, the input voltage is received from a voltage source as a regulated input voltage. This may aid with ease of control or implementation.

In some examples, the temperature sensor circuit may instead receive an amplifier supply voltage $V_{cc}$ from a supply voltage source, which may be advantageous. For example, the amount of gain compensation or correction will also be dependent on $V_{cc}$ as well as the change in temperature over the signal burst sensed by the first transistor 310 and the second transistor 312. When $V_{cc}$ is high, the amplifier provides more gain than when $V_{cc}$ is lower. For amplifier circuits according to some examples, if the $V_{cc}$ is higher, more current is stolen from the amplifier bias circuit (from the fourth transistor) and hence the gain is reduced relative to connecting the circuit to a regulated voltage which does not change when $V_{cc}$ is changed. For low $V_{cc}$, the temperature compensation circuit steals relatively less current and hence gain is increase relative to the circuit being connected to a regulated voltage. This ultimately acts to reduce the gain spread of the amplifier over voltage, as well as also correcting for the gain droop over the signal burst. Such an arrangement may be therefore be particularly useful for use in a device working under a range of voltages, as less gain variation across $V_{cc}$ may be useful. In addition, when $V_{cc}$ for the power amplifier changes, the thermal transient also changes as heat generation is correlated to $V_{cc}$. Hence, connecting the temperature sensor circuit to $V_{cc}$ can help the burst correction track more accurately over voltage relative to connecting the temperature sensor circuit to a fixed regulated voltage.

A plurality of temperature sensors, temperature sensor circuits, and/or temperature compensation circuits may be implemented in a device or amplifier network. This may be advantageous in more complex networks in which there are multiple sources of temperature variation, potentially each requiring gain compensation.

Figure 6A:
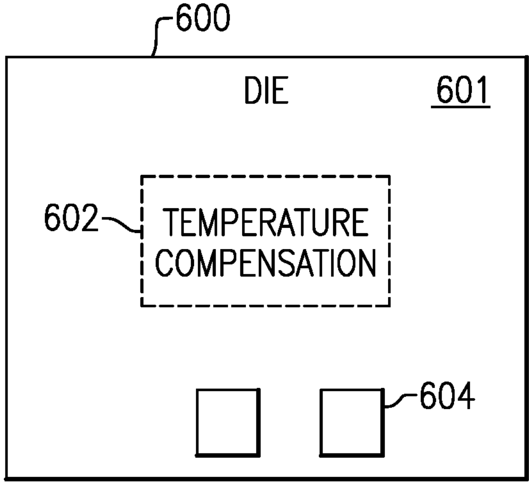
FIGS. 6A to 6C illustrate block diagrams of exemplary integrated circuits including an amplifier circuit according to aspects of the present disclosure.
Figure 6B:
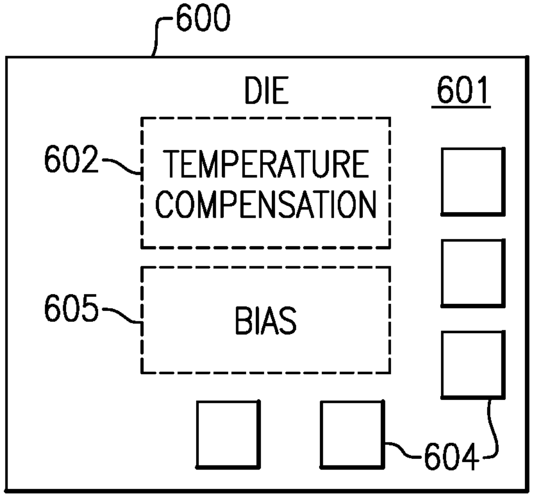
Figure 6C:
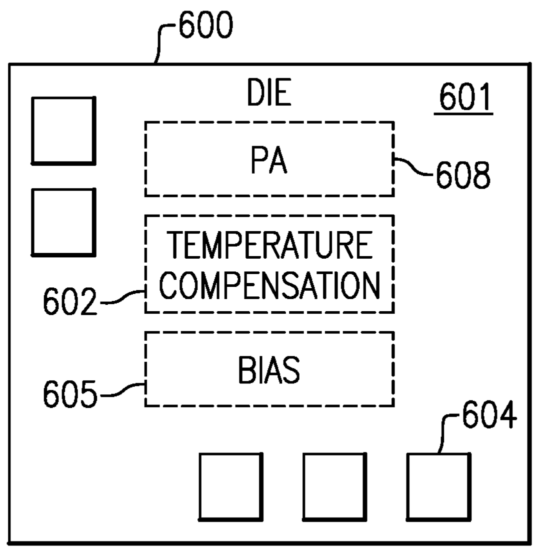

FIGS. 6A to 6C illustrate block diagrams of various integrated circuits (ICs) according to some implementations. While some example features are illustrated, those skilled in the art will appreciate from the disclosure herein that various other features have not been illustrated for the sake of brevity and so as not to obscure more pertinent aspects of the example implementations disclosed herein. For example, FIG. 6A shows that in some implementations, some or all portions of the temperature compensation circuit 602, which operates during data bursts, can be part of a semiconductor die 600. By way of an example, the temperature compensation circuit 602 can be formed on a substrate 601 of the die 600. A plurality of connection pads 604 can also be formed on the substrate 601 to facilitate functionalities associated with some or all portions of the temperature compensation circuit 602.

FIG. 6B shows that in some implementations, a semiconductor die 600 having a substrate 601 can include some or all portions of the temperature compensation circuit 602 and some or all portions of the bias circuit 605, which operates during normal operations according to conventional power amplifier (PA) biasing techniques. A plurality of connection pads 604 can also be formed on the substrate 601 to facilitate functionalities associated with some or all portions of the temperature compensation circuit 602 and some or all portions of the bias circuit 605.

FIG. 6C shows that in some implementations, a semiconductor die 600 having a substrate 601 can include some or all portions of the temperature compensation circuit 602, some or all portions of the bias circuit 605, and some or all portions of a PA 608. The plurality of connection pads 604 can also be formed on the substrate 601 to facilitate functionalities associated with some or all portions of the temperature compensation circuit 602, some or all portions of the bias circuit 605, and some or all portions of the PA 608. In an example, the die 600 is a SiGe die integrating the PA 608 and a controller that includes the temperature compensation circuit 602 and the bias circuit 605.

Figure 6D:
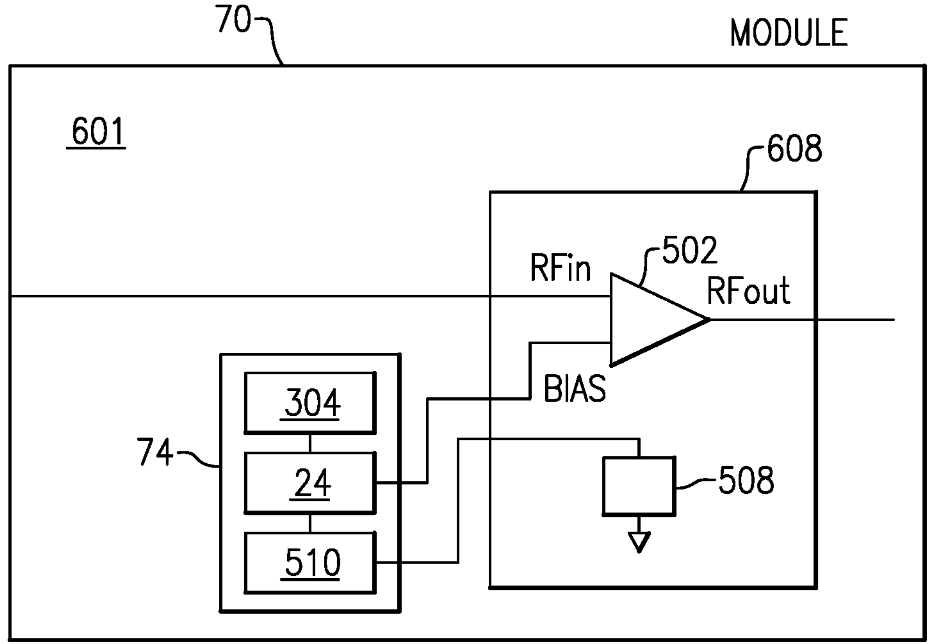
FIG. 6D illustrates a block diagram of a module including an amplifier circuit according to aspects of the present disclosure.

FIG. 6D illustrates a block diagram of a packaged module 70 that includes a power amplifier arranged to receive temperature compensated bias according to an example. The illustrated packaged module 70 includes a packaging substrate 601, a power amplifier die 608, and a controller die 74. The power amplifier die 608 includes the power amplifier 502 and the temperature sensor 508 (such as the second transistor 312). The power amplifier die 608 can be a gallium arsenide die, for example. The controller die 74 includes a temperature compensation circuit 510, a bias circuit 304, and a combining circuit 24. The controller die 74 can be a CMOS die, for example. The packaging substrate 601 can be a laminate substrate, for example. The power amplifier die 608 and the controller die 74 can be disposed on the packaging substrate 601.

Figure 7:
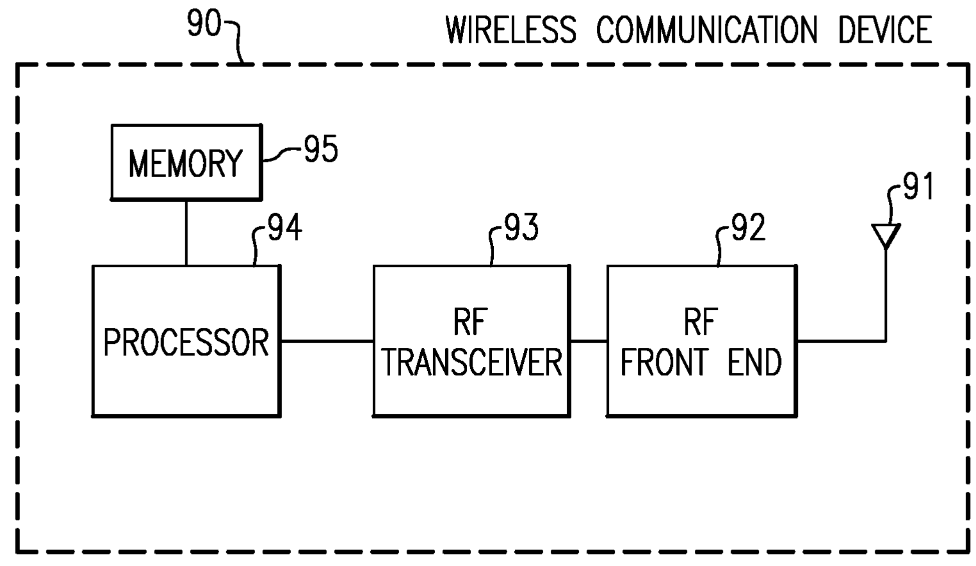
FIG. 7 illustrates a block diagram of a wireless communication device including an amplifier circuit according to aspects of the present disclosure.

FIG. 7 is a block diagram of a wireless communication device 90 that includes temperature-compensated power-amplifier biasing according to an example. The wireless communication device 90 can be any suitable wireless communication device. For instance, a wireless communication device 90 can be a mobile phone such as a smart phone, or a wireless router. As illustrated, the wireless communication device 90 includes an antenna 91, an RF front end 92, a transceiver 93, a processor 94, and a memory 95. The antenna 91 can transmit RF signals provided by the RF front end 92. The antenna 91 can transmit carrier aggregated signals provided by the RF front end 92. The antenna 91 can provide received RF signals to the RF front end 92 for processing.

The RF front end 92 can include one or more power amplifiers, one or more low-noise amplifiers, RF switches, receive filters, transmit filters, duplex filters, or any combination thereof. The RF front end 92 can transmit and receive RF signals associated with any suitable communication standards. For instance, the RF front end 92 can provide a carrier-aggregated signal to the antenna 91. The temperature compensation circuit discussed herein can adjust a gain of a power amplifier of the RF front end 92. That is, the front end 92 can include the amplifier circuit according to one or more examples discussed herein and may have one or more associated advantages as discussed herein, such as modulating bias current for an amplifier based on a temperature change sensed by the temperature sense circuit in order to compensate for gain droop as an amplifier heats up during a signal burst.

The RF transceiver 93 can provide RF signals to the RF front end 92 for amplification and/or other processing. The RF transceiver 93 can also process an RF signal provided by a low-noise amplifier of the RF front end 92.

The RF transceiver 93 is in communication with the processor 94. The processor 94 can be a baseband processor. The processor 94 can provide any suitable baseband processing functions for the wireless communication device 90. The memory 95 can be accessed by the processor 94. The memory 95 can store any suitable data for the wireless communication device 90.

Any of the principles and advantages discussed herein can be applied to systems other than the systems described above. The elements and operations of the various examples described above can be combined to provide further examples. Some of the examples described above have provided examples in connection with power amplifiers, packaged modules, and/or wireless communications devices. However, the principles and advantages of the examples can be used in connection with any other systems, apparatus, or methods that benefit could from any of the teachings herein. For instance, any of the principles and advantages discussed herein can be implemented in connection with providing temperature compensation for an amplifier that experiences changes in gain over temperature. Any of the principles and advantages discussed herein can be implemented in association with a wireless local area network (WLAN) power amplifier. Any of the principles and advantages discussed herein can be implemented in association with RF circuits configured to process signals in a range from about 30 kHz to 300 GHz, such as in a range from about 450 MHz to 7.125 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Having described above several aspects of at least one example, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. An amplifier circuit comprising:

an amplifier; and a temperature sensor circuit including a first transistor thermally isolated from the amplifier and being configured to sense an ambient temperature, and a second transistor thermally linked to the amplifier and being configured to sense a temperature at the amplifier, the temperature sensor circuit being a differential circuit having a first path and a second path with the first and second transistors being arranged on the first and second paths of the differential circuit respectively, the temperature sensor circuit being configured to generate an output voltage inversely proportional to a temperature difference between the ambient temperature and the temperature at the amplifier.

2. The amplifier circuit of claim 1 further comprising a first resistor and a second resistor arranged on the first and second paths of the differential circuit respectively, and a third resistor arranged to couple the first and second paths of the differential circuit in parallel.

3. The amplifier circuit of claim 1 further comprising a bias network coupled to the temperature sensor circuit and being configured to bias the amplifier with a reference current modulated at least in part by the output voltage.

4. The amplifier circuit of claim 3 further comprising a third transistor coupled to the temperature sensor circuit and being configured to receive the output voltage, wherein the bias network comprises a fourth transistor coupled to the third transistor.

5. The amplifier circuit of claim 4 wherein the third transistor is configured to draw less current in response to heating at the second transistor.

6. The amplifier of claim 5 wherein the fourth transistor is configured to draw more current in response to the third transistor drawing less current.

7. The amplifier circuit of claim 4 wherein the bias network further comprises a current mirror reference device which includes the fourth transistor.

8. The amplifier circuit of claim 4 further comprising a fifth transistor coupled to the third transistor, and a radio frequency gain device having a sixth transistor coupled to the fourth and fifth transistors, the radio frequency gain device being configured to provide a level of gain to an input signal dependent on a current at the sixth transistor.

9. The amplifier circuit of claim 4 wherein the third transistor comprises a base, a collector, and an emitter, the temperature sensor circuit being coupled to the base of the third transistor.

10. The amplifier circuit of claim 9 wherein the fourth transistor comprises a base, a collector, and an emitter, the collector of the third transistor being coupled to the collector of the fourth transistor.

11. The amplifier circuit of claim 1 wherein the first transistor comprises a base, a collector, and an emitter, the collector of the first transistor being coupled to the base of the first transistor.

12. The amplifier circuit of claim 11 wherein the second transistor comprises a base, a collector, and an emitter, the collector of the second transistor being coupled to the base of the second transistor.

13. The amplifier circuit of claim 1 further comprising a voltage source configured to provide a regulated input voltage to the temperature sensor circuit.

14. The amplifier circuit of claim 1 further comprising a supply voltage source configured to provide an amplifier supply voltage to the temperature sensor circuit.

15. The amplifier circuit of claim 1 wherein the amplifier is a first amplifier, and the amplifier circuit further comprises a second amplifier coupled to the first amplifier, and a bias network coupled to the temperature sensor circuit and being configured to bias the second amplifier with a reference current modulated at least in part by the output voltage.

16. A wireless communication device including an amplifier circuit, the amplifier circuit comprising:

an amplifier configured to provide a radio-frequency signal; and a temperature sensor circuit, the temperature sensor circuit including a first transistor thermally isolated from the amplifier and being configured to sense an ambient temperature, and a second transistor thermally linked to the amplifier and being configured to sense a temperature at the amplifier, the temperature sensor circuit being a differential circuit having a first path and a second path with the first and second transistors being arranged on the first and second paths of the differential circuit respectively, the temperature sensor circuit being configured to generate an output voltage inversely proportional to a temperature difference between the ambient temperature and the temperature at the amplifier.

17. A method of operating an amplifier circuit including an amplifier, the method comprising:

sensing, by a first transistor of a temperature sensor circuit, an ambient temperature, the first transistor being thermally isolated from the amplifier;

sensing, by a second transistor of the temperature sensor circuit, a temperature at the amplifier, the temperature sensor circuit being a differential circuit having a first path and a second path with the first and second transistors being arranged on the first and second paths of the differential circuit respectively; and generating, by the temperature sensor circuit, an output voltage inversely proportional to a temperature difference between the ambient temperature and the temperature at the amplifier.

18. The method of claim 17 wherein the temperature sensor circuit further comprises a first resistor and a second resistor arranged on the first and second paths of the differential circuit respectively, and a third resistor arranged to couple the first and second paths of the differential circuit in parallel.

19. The method of claim 18 wherein the amplifier circuit includes a bias network coupled to the temperature sensor circuit, the method further comprising biasing the amplifier with a reference current modulated at least in part by the output voltage.

20. The method of claim 19 wherein the amplifier circuit includes a third transistor coupled to the temperature sensor circuit and the bias network includes a fourth transistor coupled to the third transistor and to the amplifier, the method further comprising receiving, by the third transistor the output voltage from the temperature sensor circuit.

21. An amplifier circuit comprising:

an amplifier;

a temperature sensor circuit including a first transistor thermally isolated from the amplifier and being configured to sense an ambient temperature, and a second transistor thermally linked to the amplifier and being configured to sense a temperature at the amplifier, the temperature sensor circuit being a differential circuit having a first path and a second path with the first and second transistors being arranged on the first and second paths of the differential circuit respectively, the temperature sensor circuit being configured to generate an output voltage inversely proportional to a temperature difference between the ambient temperature and the temperature at the amplifier; and a third transistor coupled to the temperature sensor circuit and being configured to receive the output voltage.

22. The amplifier circuit of claim 21 further comprising a fourth transistor coupled to the third transistor.

* * * * *